US012755936B2

(12) United States Patent
Pan

(10) Patent No.: US 12,755,936 B2
(45) Date of Patent: Oct. 6, 2026

(54) SYSTEM AND METHOD FOR DELIVERING PULSED RF POWER FROM A SINGLE GENERATOR TO MULTIPLE LOADS

(71) Applicant: Yang Pan, Singapore (SG)

(72) Inventor: Yang Pan, Singapore (SG)

(73) Assignee: Inspiring Atoms Pte Ltd, Singapore (SG)

( * ) Notice: Subject to any disclaimer, the term of this patent is extended or adjusted under 35 U.S.C. 154(b) by 21 days.

(21) Appl. No.: 19/001,406

(22) Filed: Dec. 24, 2024

(65) Prior Publication Data

US 2026/0179879 A1 Jun. 25, 2026

(51) Int. Cl.
*H01J 37/32* (2006.01)

(52) U.S. Cl.
CPC ...... *H01J 37/32174* (2013.01); *H01J 37/321* (2013.01); *H01J 37/32146* (2013.01)

(58) Field of Classification Search
CPC ............... H01J 37/32174; H01J 37/321; H01J 37/32146
See application file for complete search history.

(56) References Cited

U.S. PATENT DOCUMENTS

| | | | |
|---|---|---|---|
| 6,509,542 | B1 | 1/2003 | Benjamin et al. |
| 6,920,312 | B1 | 7/2005 | Benjamin |
| 8,692,467 | B2 | 4/2014 | Benjamin et al. |
| 8,710,926 | B2 | 4/2014 | Nagarkatti et al. |
| 8,736,175 | B2 | 5/2014 | Long et al. |
| 8,736,377 | B2 | 5/2014 | Rughoonundon et al. |
| 8,741,095 | B2 | 6/2014 | Koshimizu |
| 8,962,488 | B2 | 2/2015 | Liao et al. |
| 9,059,678 | B2 | 6/2015 | Long et al. |
| 9,171,700 | B2 | 10/2015 | Gilmore |
| 9,305,750 | B2 | 4/2016 | Long et al. |
| 9,336,996 | B2 | 5/2016 | Long et al. |
| 9,390,893 | B2 | 7/2016 | Valcore, Jr. et al. |
| 9,401,264 | B2 | 7/2016 | Marakhtanov et al. |
| 9,515,633 | B1 | 12/2016 | Long et al. |
| 9,536,749 | B2 | 1/2017 | Marakhtanov et al. |
| 9,595,423 | B2 | 3/2017 | Leray et al. |
| 9,627,186 | B2 | 4/2017 | Valcore, Jr. et al. |
| 9,652,567 | B2 | 5/2017 | Valcore, Jr. et al. |
| 9,659,757 | B2 | 5/2017 | Kuthi et al. |
| 9,721,758 | B2 | 8/2017 | Coumou et al. |
| 9,872,373 | B1 | 1/2018 | Shimizu et al. |
| 9,984,859 | B2 | 5/2018 | Marakhtanov et al. |
| 10,032,605 | B2 | 7/2018 | Valcore, Jr. et al. |
| 10,056,231 | B2 | 8/2018 | Long et al. |
| 10,102,321 | B2 | 10/2018 | Povolny et al. |
| 10,141,163 | B2 | 11/2018 | Lill et al. |
| 10,157,729 | B2 | 12/2018 | Valcore, Jr. |
| 10,256,077 | B2 | 4/2019 | Valcore, Jr. et al. |
| 10,276,348 | B2 | 4/2019 | Marakhtanov et al. |

(Continued)

*Primary Examiner* — Raymond R Chai

(57) ABSTRACT

Disclosed herein is a system and method for delivering pulsed RF power from a single generator to multiple loads in semiconductor manufacturing processes. Using a Single-Pole Multi-Throw (SPMT) switch, the controller dynamically selects a load in real time to receive one or a group of pulses. Each pulse is configurable with distinct RF power, frequency, and duration, enabling precise and flexible power allocation to components such as plasma source coils, zonal electrostatic chucks, or multiple reactors.

19 Claims, 6 Drawing Sheets

(56) References Cited

U.S. PATENT DOCUMENTS

| | | | |
|---|---|---|---|
| 10,325,759 | B2 | 6/2019 | Valcore, Jr. et al. |
| 10,325,760 | B2 | 6/2019 | Valcore, Jr. et al. |
| 10,381,201 | B2 | 8/2019 | Lyndaker et al. |
| 10,403,482 | B2 | 9/2019 | Howald et al. |
| 10,431,434 | B2 | 10/2019 | Long et al. |
| 10,573,494 | B2 | 2/2020 | Shoeb et al. |
| 10,580,618 | B2 | 3/2020 | Shoeb et al. |
| 10,679,825 | B2 | 6/2020 | Wu et al. |
| 10,734,195 | B2 | 8/2020 | Long et al. |
| 10,755,895 | B2 | 8/2020 | Marakhtanov et al. |
| 10,847,345 | B2 | 11/2020 | Long et al. |
| 10,984,985 | B2 | 4/2021 | Mavretic |
| 11,038,483 | B2 | 6/2021 | Leeser et al. |
| 11,114,280 | B2 | 9/2021 | Bhutta et al. |
| 11,158,488 | B2 | 10/2021 | Radomski et al. |
| 11,224,116 | B2 | 1/2022 | Long et al. |
| 11,437,219 | B2 | 9/2022 | Long et al. |
| 11,716,059 | B2 | 8/2023 | Raymond et al. |
| 11,915,912 | B2 | 2/2024 | Shoeb et al. |
| 2015/0235808 | A1 | 8/2015 | Kamp et al. |
| 2016/0268100 | A1 | 9/2016 | Valcore, Jr. et al. |
| 2017/0084429 | A1 | 3/2017 | Marakhtanov et al. |
| 2017/0372912 | A1 | 12/2017 | Long et al. |
| 2018/0358205 | A1 | 12/2018 | Long et al. |
| 2019/0109576 | A1 | 4/2019 | Long et al. |
| 2019/0149119 | A1 | 5/2019 | Kapoor et al. |
| 2020/0168438 | A1 | 5/2020 | Shoeb et al. |
| 2020/0243304 | A1 | 7/2020 | Valcore, Jr. et al. |
| 2020/0411285 | A1* | 12/2020 | Mavretic ........... H01J 37/32082 |
| 2021/0082667 | A1* | 3/2021 | Zhao ................... H01J 37/3299 |
| 2021/0183619 | A1 | 6/2021 | Patrick et al. |
| 2021/0210314 | A1 | 7/2021 | Wang et al. |
| 2022/0199365 | A1 | 6/2022 | Long et al. |
| 2022/0216038 | A1 | 7/2022 | Wu et al. |
| 2023/0113683 | A1 | 4/2023 | Long |
| 2023/0126058 | A1 | 4/2023 | Long et al. |
| 2023/0245873 | A1 | 8/2023 | Long et al. |
| 2023/0253183 | A1* | 8/2023 | Mavretic ........... H01J 37/32082 333/32 |
| 2023/0290611 | A1 | 9/2023 | Benjamin et al. |
| 2023/0360883 | A1 | 11/2023 | Long et al. |
| 2024/0290578 | A1* | 8/2024 | Ramaswamy ........ H01J 37/321 |

* cited by examiner

SYSTEM AND METHOD FOR DELIVERING PULSED RF POWER FROM A SINGLE GENERATOR TO MULTIPLE LOADS

FIELD

The present invention relates to systems and methods for delivering radio frequency (RF) power from a single power generator to multiple loads, particularly as applied to semiconductor manufacturing process systems.

BACKGROUND

In semiconductor manufacturing, processes such as plasma etching may require the delivery of RF power to multiple components, such as the center and edge coils of plasma sources. Conventional methods often rely on multiple RF generators or fixed distribution networks, which can be inefficient and lack flexibility in power allocation.

High-speed switching technologies, such as those using GaN high-electron-mobility transistors (GaN HEMT), offer the potential to improve RF power delivery by enabling rapid and precise distribution of RF signals from a single power generator to multiple loads. However, such opportunities have not been fully realized in semiconductor manufacturing process systems.

This invention addresses these challenges by providing an innovative RF power distribution system with configurable pulse trains and advanced switching mechanisms, enhancing efficiency and precision in semiconductor manufacturing processes.

SUMMARY

The present invention provides an RF system for delivering RF power from a single power generator to multiple loads with high design flexibility. The system utilizes a Single-Pole Multi-Throw (SPMT) switch to achieve high-speed and high-power RF power distribution. In one implementation, the switch is implemented using GaN HEMT.

The RF power generator outputs a master pulse train, which includes an RF signal modulated by a square waveform characterized by its duty cycle. A controller utilizes the SPMT switch to direct each pulse in the master pulse train to one of the selected nodes at a time.

In some implementations, the controller may group the pulses and use the SPMT to deliver a group of pulses, instead of a single pulse, to the selected load.

In one implementation, each load is associated with a match, which is a resonator to match the impedance of the selected load to the output of the RF power generator, including the effects of the SPMT switch and transmission lines.

In another implementation, the loads share a single match whose impedance can be adjusted within a range to match the selected load.

In some implementations, the RF power generator is configured to generate a pulse or a group of pulses with varied parameters, such as RF power level, RF frequency, and pulse duration. The controller can assign the varied parameters to different pulses to enhance the performance of the process systems.

The RF system is further characterized by precise timing control of pulse generation and switching operations of the SPMT switch. Latency between pulse generation and switching must be incorporated in design to coordinate the operations by the controller. In some aspects, each pulse is labeled and counted by the controller.

The RF system can be employed in various process systems. In some implementations, the RF system distributes RF power to plasma source coils of an Inductively Coupled Plasma (ICP) or Transformer Coupled Plasma (TCP) reactor, enabling independent control of power levels to the center and edge coils by adjusting the allocated pulse ratios.

In some other implementations, the RF system distributes RF power to zones of an ESC, enabling independent control of the zonal bias of the ESC.

In still other implementations, the RF system distributes RF power to multiple reactors of a process system, enabling independent control of the delivered power to each reactor.

The present inventive concept provides flexibility and scalability for RF power distribution to multiple loads from a single power generator.

BRIEF DESCRIPTION OF DRAWINGS

For enhanced clarity, the following description refers to the accompanying drawings.

DETAILED DESCRIPTION

To ensure comprehensive understanding, this section delves into detailed embodiments of the present invention. Although certain specifics are provided for clarity, modifications and variations that align with the subsequent claims are deemed appropriate. Conventional methods and components are highlighted to underscore the distinct features of the invention.

Terms

RF Power Generator: A device capable of generating RF signals at one or more predetermined frequencies.

Single-Pole Multi-throw (spmt) Switch: a switch that routes RF power from one input to multiple outputs with high-speed switching capabilities using exemplarily GaN HEMT.

GaN High-Electron-Mobility Transistor (GaN HEMT): High-performance transistors made from Gallium Nitride, offering high-speed switching (nanoseconds to microseconds), low conduction losses, and the ability to handle RF power up to tens of kilowatts.

Pulse Train: A series of pulses with a defined frequency, duty cycle, and power level, used to modulate RF signals for delivery to specific loads.

Master Pulse Train: A pulse train generated by the RF power generator, characterized by an RF signal modulated by a square waveform, with specific parameters like duty cycle and frequency.

Controller: A component that coordinates the operation of the RF system, including pulse generation, load selection via the SPMT switch, and timing synchronization.

Match: A circuit that optimizes the transfer of RF power to a load by minimizing signal reflections and ensuring impedance matching.

Duty Cycle: The proportion of time during which an RF signal is active within a single period of the pulse waveform, expressed as a percentage.

Impedance Matching: The process of adjusting the impedance of a load to match the source impedance to ensure efficient power transfer and minimize reflections.

Capacitive Load: A type of load where the primary electrical characteristic is capacitance, as seen in zones of an Electrostatic Chuck (ESC) for controlling bias voltages.

Zonal Electrostatic Chuck (ESC): A device with multiple zones capable of receiving RF power to control individual bias voltages for semiconductor manufacturing processes.

Plasma Source Coil: A component in an ICP or TCP reactor that receives RF power to generate and sustain plasma for etching or deposition processes.

Figure 1A:
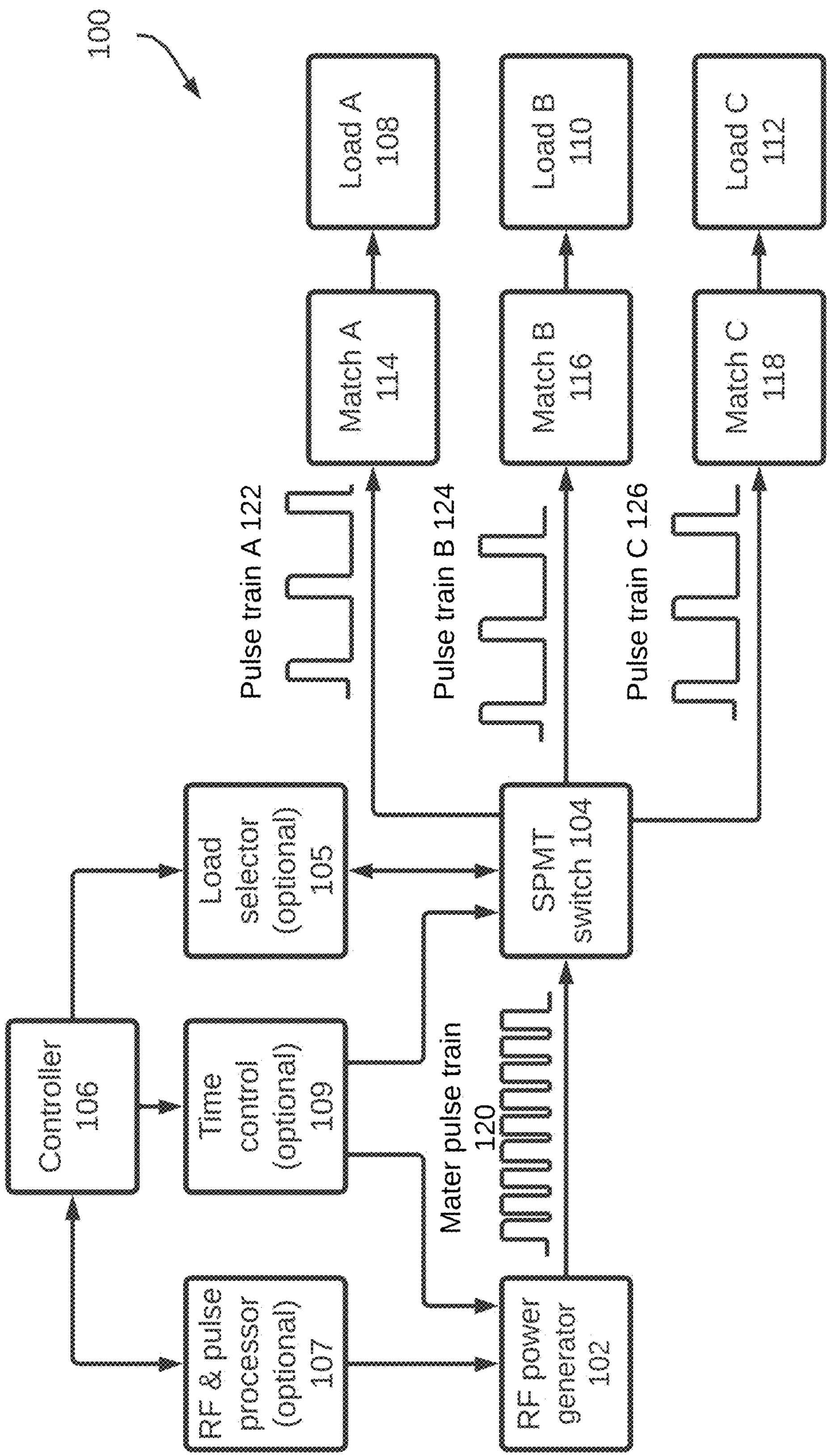
FIG. 1A: Depicts an exemplary RF system for delivering RF power from a single generator to three loads using independent matches in a first embodiment.

FIG. 1A presents a first embodiment of RF system 100 for delivering RF power from a single generator 102 to three loads (108, 110, 112). While three loads are used for illustration, the system may support a greater or lesser number of loads.

In one implementation, the RF power generator 102 delivers RF power at a single frequency, such as, for example, 1 MHz. In another implementation, the RF power generator 102 may output multiple frequencies, such as 400 kHz, 1 MHz, and 13.56 MHz. The RF power generator 102 can deliver RF power at a predetermined frequency with a specified output power range, such as 50 to 2000 watts.

Figure 1B:
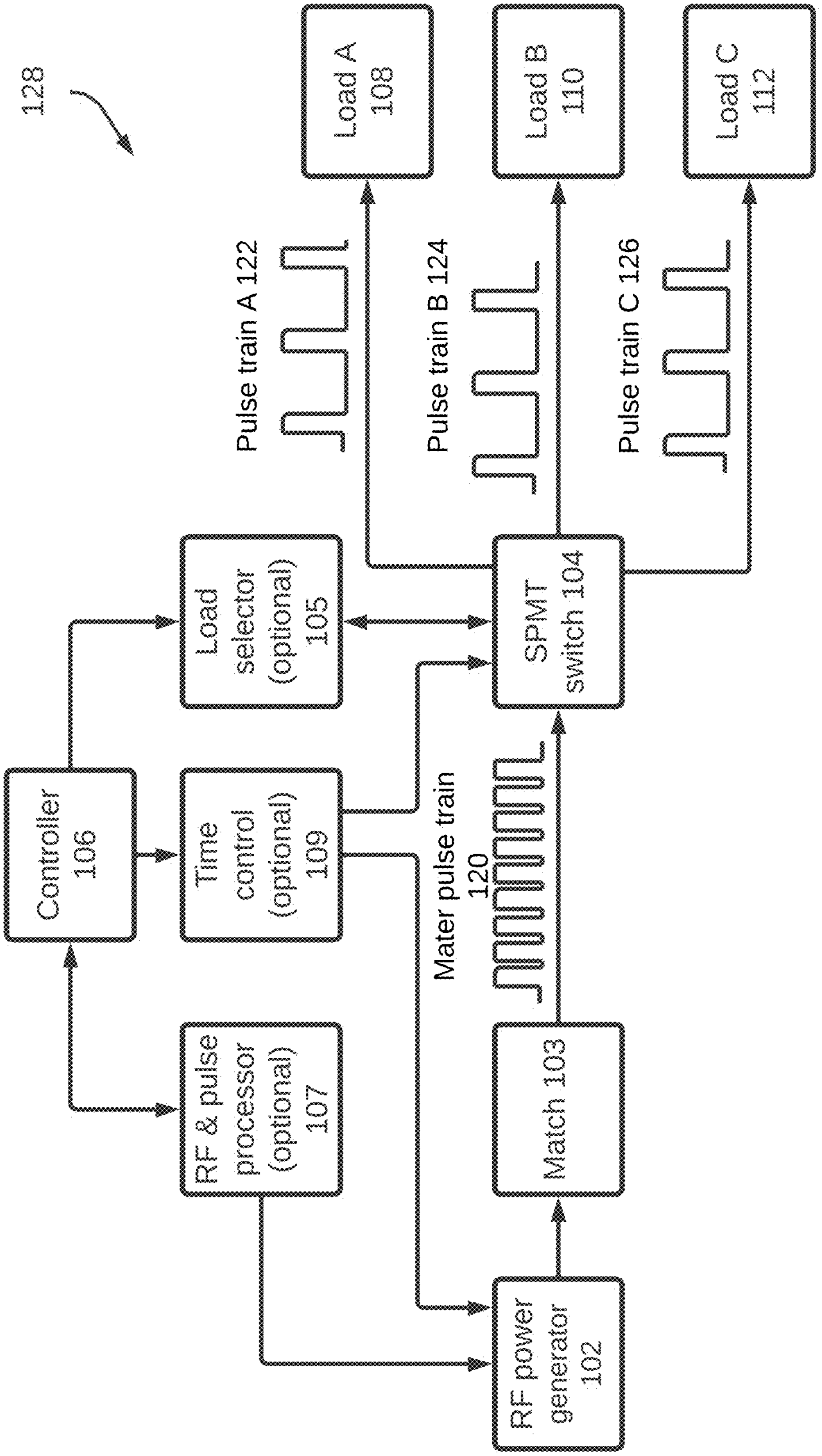
FIG. 1B: Depicts an exemplary RF system for delivering RF power from a single generator to three loads using a shared match in a second embodiment.

The output of the RF power generator 102 is coupled to a Single-Pole Multi-Throw (SPMT) switch 104, which selects a load for the RF power generator 102 at a specific time. In one configuration, the RF power generator 102 is coupled to each load through a distinct matching network, designated as match A 114 for load A 108, match B 116 for load B 110, and match C 118 for load C 112, respectively. Alternatively, the matches may be configured as a single shared match as shown in FIG. 1B as a second embodiment, denoted as 128. The single match 103 may comprise electrically tunable components or adjustable operating frequencies to accommodate different loads.

The RF power delivered from the RF power generator 102 is pulsed in the form of a master pulse train, denoted as 120. Pulsing is achieved by imposing a square wave on the RF signals with a predetermined duty cycle. The square wave may have a frequency ranging from 100 Hz to 100 kHz, and the duty cycle for the master pulse train may range from 5% to 95%.

The SPMT switch 104 is a critical component in this RF system. In one implementation, GaN HEMTs are employed for rapid switching. GaN HEMTs are particularly suited for this application due to their superior material properties, such as high electron mobility, wide bandgap, and excellent thermal conductivity. These attributes enable GaN HEMTs to operate efficiently at high switching frequencies (up to several hundred megahertz) and handle significant power levels up to tens of kilowatts, making them ideal for RF applications in semiconductor manufacturing process systems, which require rapid and precise control.

The SPMT switch 104 uses multiple GaN HEMTs arranged to connect the output of the RF generator 102 to multiple loads as shown exemplarily in FIG. 1A. The nanosecond-to-microsecond switching capability of GaN HEMT ensures that the RF system 100 can maintain precise control over the timing and distribution of RF power, even in demanding plasma process environments.

Additionally, GaN HEMTs exhibit low conduction losses and high breakdown voltage, ensuring reliable performance in high-power RF systems. This makes them suitable for handling power levels exceeding tens of kilowatts, as required for modern semiconductor manufacturing processes.

The SPMT switch 104 can also be constructed using silicon power transistors like Si MOSFETs or SiC MOSFETs. The SPMT switch 104 can also be constructed using relays like mechanical relays.

A controller 106 coordinates the overall operation of the RF system 100. The controller 106 selects a load via the switch 104 for each pulse within the master pulse train 120. Optionally, the controller 106 may use a load selector 105, which can be implemented as software, firmware, hardware, or a combination thereof. The controller 106 may also include a pulse counter to identify and label each pulse. A time control 109 can be implemented optionally to control the timing of pulse generation within the RF power generator 102 and the switching timing of the switch 104. For example, a delay between pulse generation and switching operations of the switch 102 can be modeled or measured and subsequently recorded in a storage unit of the controller 106. The time control 109 utilizes the data and coordinates the operations of pulse generation and switching to ensure precise delivery of selected pulses into the designated load.

The switch 104 outputs three pulse trains, designated as pulse train A 122, pulse train B 124, and pulse train C 126, respectively. These pulse trains have a lower duty cycle than the master pulse train 120. In one implementation, the sum of the duty cycles of pulse trains 122, 124, and 126 equals the duty cycle of the master pulse train 118. The time control 109 may be software, firmware, hardware, or a combination of them.

In another implementation, several or more pulses may be grouped and delivered to a selected load instead of delivering a single pulse at a time.

In a more generalized implementation, each pulse may vary in RF frequency, power level, or duration. An optional RF and pulse processor 107 may condition each pulse under the supervision of the controller 106. The processor 107 may also be implemented as software, firmware, hardware, or a combination thereof.

Figure 2A:
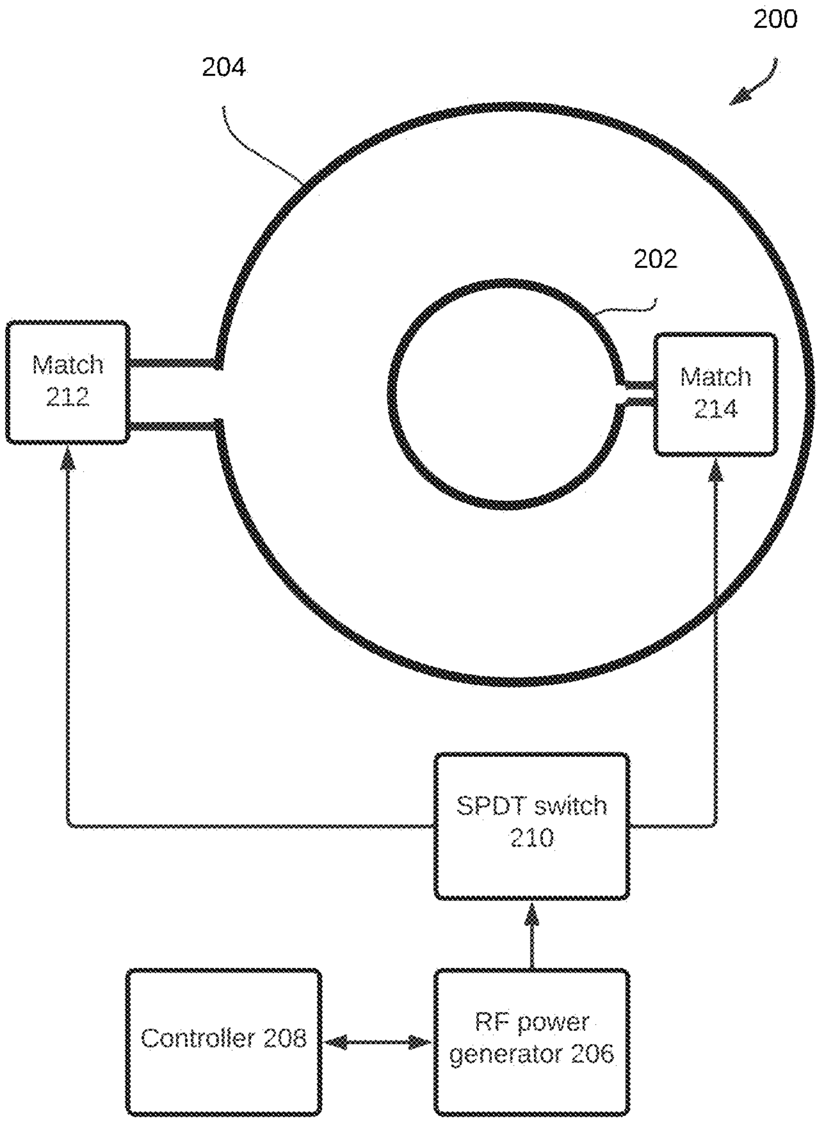
FIG. 2A: Showcases a first implementation of an RF system for delivering RF power from a single generator to center and edge coils of a plasma source for an ICP or TCP etch process system.

FIG. 2A illustrates a first implementation of the RF system 100 applied in a semiconductor manufacturing process, such as an etching process system denoted as 200. System 200 exemplifies a plasma source for an ICP or a TCP reactor, typically used for an etch process system, comprising a center coil 202 and an edge coil 204. While a single-turn coil is shown for illustration, coils with multiple turns are also feasible.

Under the supervision of a controller 208, a Single-Pole Double-Throw (SPDT) switch 210 selects either the center or edge coil for receiving RF power from the RF power generator 206. SPDT is a specific version of the SPMT for two loads. For instance, the RF power generator 206 outputs a master pulse train, and each pulse is directed by the switch 210 either to the center coil 202 via a match 214 or to the edge coil 204 via a match 212. The controller 208 determines the power level delivered to each coil by controlling the ratio of pulses sent to the coils.

Figure 2B:
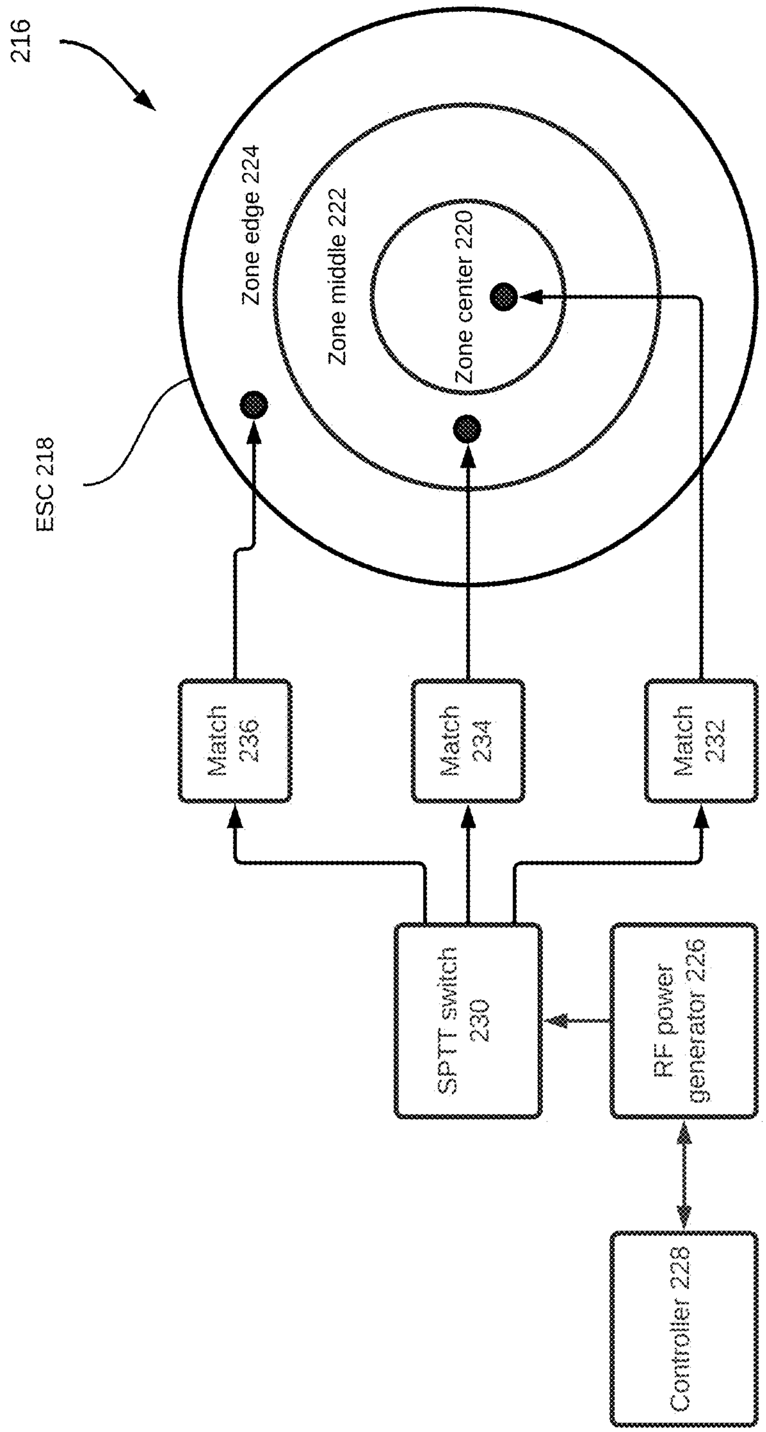
FIG. 2B: Showcases a second implementation of an RF system for delivering RF power from a single generator to three zones of an ESC for independently controlling the bias voltages of the zones.

FIG. 2B illustrates a second implementation of the RF system 100 applied to a zonal electrostatic chuck (ESC), denoted as 216. An ESC 218 includes exemplarily three concentric zones: zone center 220, zone middle 222, and zone edge 224. Each zone can receive RF power generated from RF power generator 226 and provide a distinct bias voltage. In such an implementation, each zone represents a capacitive load for a capacitor comprising an anode and a cathode. A controller 228 operates the RF power generator 226 to generate RF power in the form of the master pulse train. Subsequently, it selects, through a Single-Pole Triple-Throw (SPTT) switch 230, one of the zones to receive a specific pulse. The SPTT is a specific implementation of SPMT for three loads. Each of the loads is associated with a match 232, 234, 236, respectively. In an alternative implementation, a single match with electrically tunable components or tunable frequencies may be used for all three loads.

Figure 2C:
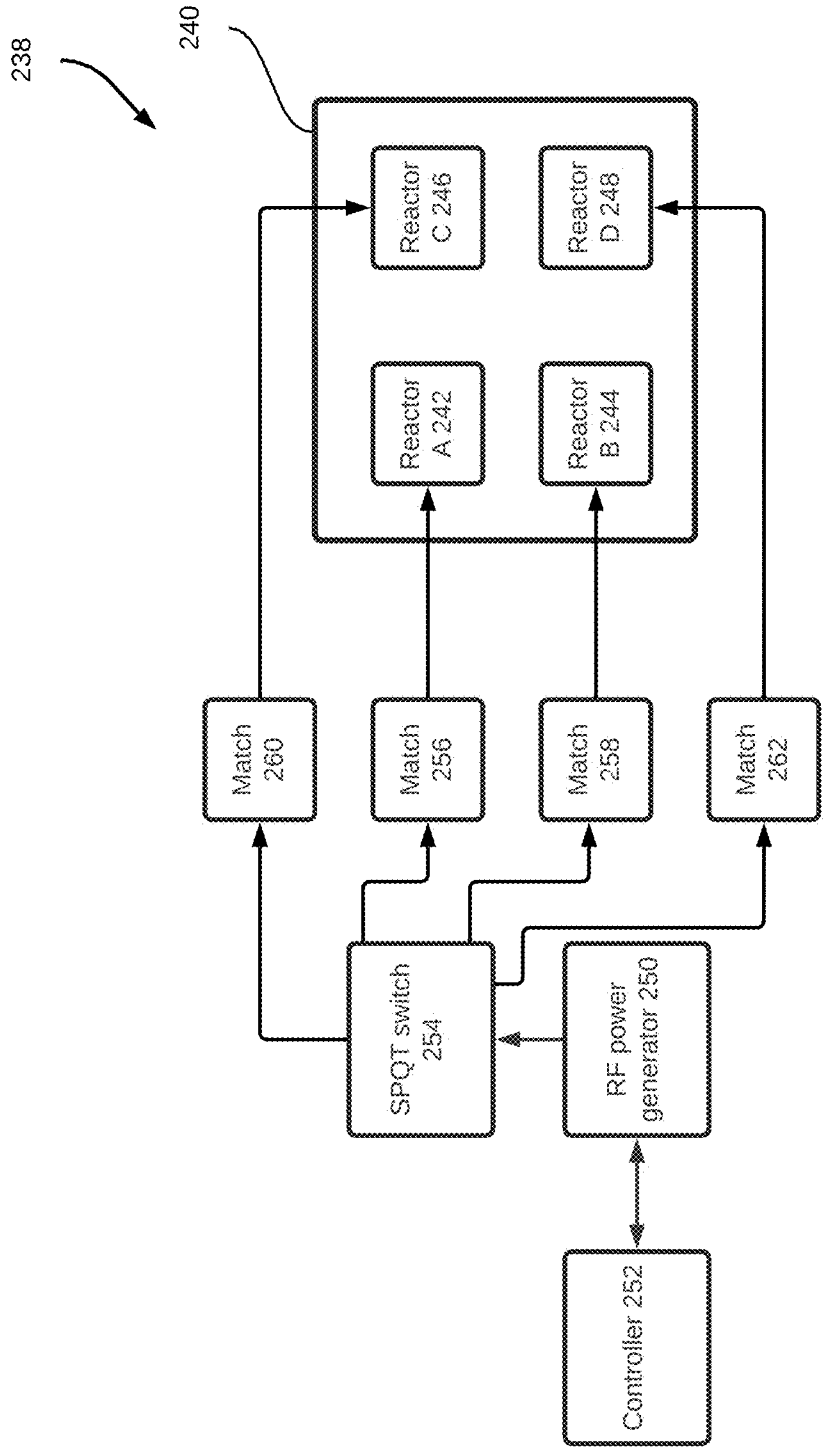
FIG. 2C: Showcases a third implementation of an RF system for delivering RF power from a single generator to four reactors of a process system.

FIG. 2C illustrates a third implementation of the RF system 100 applied in process system 238 comprising four reactors: reactor A 242, reactor B 244, reactor C 246, and reactor D 248. The reactors can be any process system using plasma. In the context of the etch process systems, the reactors can be either ICP or TCP reactors or CCP reactors. Each reactor represents a load for the RF power generator 250. As shown in FIG. 1C, each load is associated with a match (256, 258, 260, 262), respectively. A controller 252 operates the RF power generator 250 to generate a master pulse train. Each pulse from the master pulse train is delivered to a designated load controlled by a Single-Pole Quadruple-Throw (SPQT) switch 254, wherein SPQT is a specific implementation of SPMT for four loads. In an alternative implementation, a single match with tunable components or tunable frequency may be used to replace the multiple dedicated matches.

Figure 3:
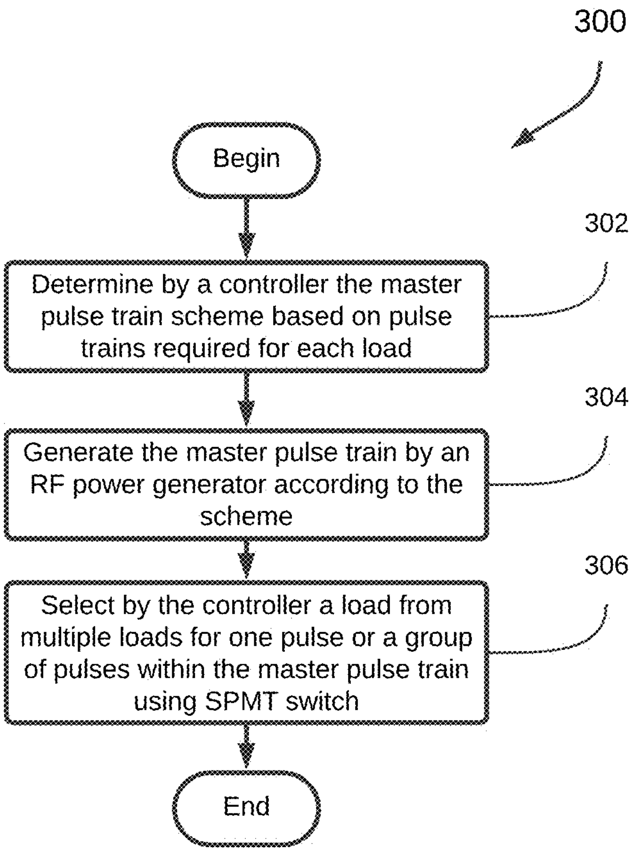
FIG. 3: Illustrates a flowchart of the exemplary RF system in operation.

FIG. 3 depicts a flowchart for a method of delivering RF power to multiple loads. Process 300 begins with step 302, where the controller 106 determines the master pulse train scheme based on the pulse train requirements for each load. The controller 106 may assign different power levels, frequencies, and durations for each of the pulses in the master pulse train. This opens the way to optimize the RF power delivery to each of the loads to optimize the performance of a semiconductor manufacturing process system, such as for etch and deposition process systems.

In step 304, the controller 106 generates the master pulse train 118 according to the determined scheme. In step 306, each pulse is delivered to a specific load via the SPMT switch 104 under the supervision of the controller 106.

The invention claimed is:

1. An RF system for a semiconductor manufacturing process system, comprising:

an RF power generator configured to generate RF power in the form of a master pulse train;

a plurality of coils of an inductively coupled plasma (ICP) source or a transformer coupled plasma (TCP) source to receive a subset of the pulses from the master pulse train;

a single pole multi-throw (SPMT) switch configured to select a coil from the plurality of the coils to receive one pulse or a group of the pulses in the master pulse train; and a controller configured to coordinate the operations of the RF power generator and the SPMT switch.

2. The system of claim 1, further comprising a time control module configured to coordinate timing of generating a specific pulse and selecting a coil for the pulse by the SPMT switch.

3. The system of claim 2, further comprising a load selector configured to select the load, wherein the load includes the coils.

4. The system of claim 3, wherein the load selector is implemented as software, firmware, hardware, or a combination of thereof.

5. The system of claim 1, further comprising an RF and pulse processor configured to condition each pulse in the master pulse train.

6. The system of claim 5, wherein the processor is configured to assign a power level, RF frequency, or duration of the pulse.

7. The system of claim 1, wherein the SPMT switch comprises GaN HEMTs.

8. The system of claim 1, wherein the coils leads include a center coil and an edge coil.

9. The system of claim 1, further comprising a plurality of matches, each of which is associated with a coil.

10. The system of claim 1, further comprising a shared match for the plurality of coils, the shared match including electrically tunable components.

11. An RF system for a semiconductor manufacturing process system, comprising:

an RF power generator configured to generate RF power in the form of a master pulse train;

a plurality of loads including independently biased zones of a zonal electrostatic chuck (ESC) to receive a subset of the pulses from the master pulse train;

a SPMT switch configured to select a zone from the plurality of the zones to receive one pulse or a group of the pulses in the master pulse train; and a controller configured to coordinate the operations of the RF power generator and the SPMT switch.

12. The system of claim 11, further comprising a time control module configured to coordinate timing of generating a specific pulse and selecting a zone for the pulse by the SPMT switch.

13. The system of claim 12, further comprising a load selector configured to select the independently biased zone.

14. The system of claim 13, wherein the load selector is implemented as software, firmware, hardware, or a combination of thereof.

15. The system of claim 11, further comprising an RF and pulse processor configured to condition each pulse in the master pulse train.

16. An RF system for a semiconductor manufacturing process system, comprising:

an RF power generator configured to generate RF power in the form of a master pulse train;

a plurality of loads including reactors within a process system to receive a subset of the pulses from the master pulse train;

a SPMT switch configured to select a reactor from the plurality of the reactors to receive one pulse or a group of the pulses in the master pulse train; and a controller configured to coordinate the operations of the RF power generator and the SPMT switch.

17. The system of claim 16, further comprising a time control module configured to coordinate timing of generating a specific pulse and selecting a reactor for the pulse by the SPMT switch.

18. The system of claim 17, further comprising a load selector configured to select the reactor.

19. The system of claim 18, wherein the load selector is implemented as software, firmware, hardware, or a combination of thereof.

* * * * *